United States Patent
Nakamura et al.

(10) Patent No.: US 7,846,257 B2
(45) Date of Patent: Dec. 7, 2010

(54) METHOD FOR CLEANING SUBSTRATE PROCESSING APPARATUS, SUBSTRATE PROCESSING APPARATUS, PROGRAM AND RECORDING MEDIUM HAVING PROGRAM RECORDED THEREIN

(75) Inventors: Hiroshi Nakamura, Yamanashi (JP); Kiyohito Iijima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1091 days.

(21) Appl. No.: 11/548,872

(22) Filed: Oct. 12, 2006

(65) Prior Publication Data

US 2007/0131253 A1 Jun. 14, 2007

Related U.S. Application Data

(60) Provisional application No. 60/773,652, filed on Feb. 16, 2006.

(30) Foreign Application Priority Data

Dec. 14, 2005 (JP) .............................. 2005-360822

(51) Int. Cl.
*B08B 6/00* (2006.01)
(52) U.S. Cl. .............................. 134/1; 134/1.1; 134/1.2; 134/1.3; 134/18; 134/21; 134/22.1; 134/22.18; 134/25.4; 134/37; 134/42; 134/902
(58) Field of Classification Search ...................... 134/1, 134/1.1, 1.2, 1.3, 18, 21, 22.1, 22.18, 25.4, 134/37, 42, 902
See application file for complete search history.

(56) References Cited

U.S. PATENT DOCUMENTS

| | | | | |
|---|---|---|---|---|
| 5,158,644 A * | 10/1992 | Cheung et al. | .............. | 438/694 |
| 5,207,836 A * | 5/1993 | Chang | .............. | 134/1 |
| 5,507,874 A * | 4/1996 | Su et al. | .............. | 134/1 |
| 5,536,330 A * | 7/1996 | Chen et al. | .............. | 134/21 |
| 5,843,239 A * | 12/1998 | Shrotriya | .............. | 134/1.1 |
| 6,067,999 A * | 5/2000 | Hines et al. | .............. | 134/1.1 |
| 6,090,718 A * | 7/2000 | Soga et al. | .............. | 438/714 |
| 6,274,058 B1 * | 8/2001 | Rajagopalan et al. | .............. | 216/67 |
| 2003/0047191 A1 * | 3/2003 | Liu | .............. | 134/1 |
| 2004/0000321 A1 * | 1/2004 | Cui et al. | .............. | 134/1.2 |
| 2006/0162742 A1 * | 7/2006 | Moriya et al. | .............. | 134/1.1 |
| 2007/0020941 A1 * | 1/2007 | Tamura et al. | .............. | 438/710 |

FOREIGN PATENT DOCUMENTS

JP 2005-101539 4/2005

* cited by examiner

*Primary Examiner*—Sharidan Carrillo
(74) *Attorney, Agent, or Firm*—Oblon, Spivak, McClelland, Maier & Neustadt, L.L.P.

(57) ABSTRACT

The substrate processing apparatus includes a plurality of processing chambers. A given processing chamber is cleaned by first executing first processing during which voltage application control is executed to control a voltage applied to an electrostatic chuck based upon first processing voltage application information provided for the particular processing chamber while drawing an inert gas into the processing chamber and evacuating the processing chamber sustaining therein low pressure conditions therein and then executing second processing during which voltage application control is executed to control the voltage application to the electrostatic chuck based upon second processing voltage application information for the processing chamber while drawing in the inert gas and evacuating the processing chamber, the internal pressure of which is set to a high level. As a result, the inside of the processing chamber can be cleaned with voltage settings optimized for the structure adopted in the processing chamber.

9 Claims, 11 Drawing Sheets

FIG.5

| FIRST PARTICLE REDUCTION PROCESSING GO/NO GO SETTING INFORMATION | |
|---|---|
| FIRST PROCESSING CHAMBER | GO |
| SECOND PROCESSING CHAMBER | GO |
| THIRD PROCESSING CHAMBER | GO |
| FOURTH PROCESSING CHAMBER | NO GO |

FIG.6A

| VOLTAGE APPLICATION SETTING INFORMATION FOR FIRST PARTICLE REDUCTION PROCESSING | FIRST PROCESSING CHAMBER | SECOND PROCESSING CHAMBER | THIRD PROCESSING CHAMBER | FOURTH PROCESSING CHAMBER |
|---|---|---|---|---|
| POSITIVE VOLTAGE (V) | $+P_{11}$ | $+P_{12}$ | $+P_{13}$ | $+P_{14}$ |
| NEGATIVE VOLTAGE (V) | $-Q_{11}$ | $-Q_{12}$ | $-Q_{13}$ | $-Q_{14}$ |
| VOLTAGE APPLICATION HOLDING TIME (SEC) | $T_{11}$ | $T_{12}$ | $T_{13}$ | $T_{14}$ |
| NUMBER OF REPETITIONS | $R_{11}$ | $R_{12}$ | $R_{13}$ | $R_{14}$ |

FIG.6B

| VOLTAGE APPLICATION SETTING INFORMATION FOR SECOND PARTICLE REDUCTION PROCESSING | FIRST PROCESSING CHAMBER | SECOND PROCESSING CHAMBER | THIRD PROCESSING CHAMBER | FOURTH PROCESSING CHAMBER |
|---|---|---|---|---|
| POSITIVE VOLTAGE (V) | $+P_{21}$ | $+P_{22}$ | $+P_{23}$ | $+P_{24}$ |
| NEGATIVE VOLTAGE (V) | $-Q_{21}$ | $-Q_{22}$ | $-Q_{23}$ | $-Q_{24}$ |
| VOLTAGE APPLICATION HOLDING TIME (SEC) | $T_{21}$ | $T_{22}$ | $T_{23}$ | $T_{24}$ |
| NUMBER OF REPETITIONS | $R_{21}$ | $R_{22}$ | $R_{23}$ | $R_{24}$ |

METHOD FOR CLEANING SUBSTRATE PROCESSING APPARATUS, SUBSTRATE PROCESSING APPARATUS, PROGRAM AND RECORDING MEDIUM HAVING PROGRAM RECORDED THEREIN

CROSS-REFERENCE TO RELATED APPLICATIONS

This document claims priority to Japanese Patent Application Number 2005-360822, filed on Dec. 14, 2005 and U.S. Provisional Application No. 60/773,652, filed on Feb. 16, 2006, the entire content of which are hereby incorporated by reference."

FIELD OF THE INVENTION

The present invention relates to a method for cleaning a substrate processing apparatus, a substrate processing apparatus, a program and a recording medium having recorded therein the program.

BACKGROUND OF THE INVENTION

A substrate processing apparatus such as a plasma processing apparatus employed in the production of, for instance, semiconductor devices includes a processing chamber where a substrate to be processed such as a semiconductor wafer or a liquid crystal substrate placed on a stage disposed therein undergoes an etching process, a film formation process or the like.

It is crucial to prevent contamination of the substrate being processed in such a substrate processing apparatus by particles (foreign matter taking the form of fine particles) of reaction products occurring while the substrate is being processed in the processing chamber or fine particles entering the processing chamber from the outside.

For instance, if the wafer stage disposed inside the processing chamber becomes contaminated by particles, particles may settle onto the rear surface of the substrate placed on the stage, which may result in the contamination spreading through the subsequent processes. In addition, if the inner wall of the processing chamber is contaminated by particles, some particles on the inner wall may settle onto the next substrate to undergo the processing, and in this case, the processing may be adversely affected. The contamination of substrates undergoing processing with particles, which occurs as described above, leads to problems including a reduced yield of semiconductor devices manufactured on the substrates as final products.

The methods proposed in the related art to be adopted to effectively eliminate particles in the processing chamber include a cleaning method whereby the particles are lifted off and scattered and eliminated with maxwell stress generated by, for instance, applying a high voltage to the stage (see Japanese Laid Open Patent Publication No. 2005-101539). More specifically, as the processing chamber is evacuated while supplying an inert gas into the processing chamber, a two-stage cleaning process is executed by first applying a high-voltage to the stage in a low-pressure environment and then applying a high voltage to the stage in a high-pressure environment, thereby effectively lifting off and scattering the particles and then discharging them from the processing chamber.

The processing chamber normally assumes a specific structure designed in correspondence to the type of wafer processing to be executed in the processing chamber, the processing conditions (e.g., the processing chamber internal pressure, the processing gas type, the levels of high-frequency power applied to the electrodes and the level of voltage applied to the stage) and the parts disposed within the processing chamber. It has been learned that by actually cleaning processing chambers assuming various structures, an abnormal electrical discharge (e.g., an arc discharge) sometimes occurs while a voltage is applied to the stage in the low-pressure environment depending upon the structure adopted in the particular processing chamber. Such an abnormal electrical discharge may cause an emergency stop of the entire substrate processing apparatus, which, in turn, may lead to reduced throughput for the overall substrate processing apparatus or damage to a component such as the stage.

SUMMARY OF THE INVENTION

Accordingly, an object of the present invention, which has been completed by addressing the problems of the related art discussed above, is to provide a method for cleaning a substrate processing apparatus that enables execution of optimal cleaning processing for the particular processing chamber by preventing an abnormal electrical discharge from occurring while cleaning the inside of the processing chamber.

The object described above is achieved in an aspect of the present invention by providing a cleaning method for cleaning a substrate processing apparatus that includes a processing chamber where a specific type of processing is executed on a substrate to be processed, to be adopted when cleaning the inside of the processing chamber. The substrate processing apparatus cleaning method comprises a first processing step in which voltage application control is executed to control voltage application to a member disposed within the processing chamber based upon first processing voltage application information set and stored in a setting information storage means, with the processing chamber sustaining therein a low-pressure environment as a specific gas is supplied into the processing chamber via a gas supply system and the processing chamber is evacuated by an evacuation system, and a second processing step in which with the atmosphere inside the processing chamber made to achieve a higher pressure than the pressure set for the first processing step, voltage application control is executed for the member based upon second processing voltage application information set and stored in the setting information storage means while the specific gas is supplied into the processing chamber via the gas supply system and the processing chamber is evacuated by the evacuation system. The member disposed inside the processing chamber for which the voltage application control is executed in this method may be an electrostatic holding means for holding the substrate onto a stage.

The object described above is also achieved in another aspect of the present invention by providing a program for enabling cleaning processing to be executed on a substrate processing apparatus that includes a processing chamber where a specific type of processing is executed on the substrate to be processed to be adopted to clean the inside of the processing chamber. The program enables a computer to execute a first processing step in which voltage application control is executed to control voltage application to a member disposed within the processing chamber based upon first processing voltage application information set and stored in a setting information storage means, with the processing chamber sustaining therein a low-pressure environment as a specific gas is supplied into the processing chamber via a gas supply system and the processing chamber is evacuated by an evacuation system and a second processing step in which with the atmosphere inside the processing chamber made to achieve a higher pressure than the pressure set for the first processing step, voltage application control is executed for the member based upon second processing voltage application information set and stored in the setting information storage means while the specific gas is supplied into the processing chamber via the gas supply system and the processing chamber is evacuated by the evacuation system.

The object is further achieved in yet another aspect of the present invention by providing a recording medium having recorded therein a program for enabling cleaning processing to be executed on a substrate processing apparatus that includes a processing chamber where a specific type of processing is executed on a substrate to be processed, to be adopted to clean the inside of the processing chamber. The recording medium is a computer-readable recording medium, having recorded therein a program that enables a computer a computer to execute a first processing step in which voltage application control is executed to control voltage application to a member disposed within the processing chamber based upon first processing voltage application information set and stored in a setting information storage means, with the processing chamber sustaining therein a low-pressure environment as a specific gas is supplied into the processing chamber via a gas supply system and the processing chamber is evacuated by an evacuation system and a second processing step in which with the atmosphere inside the processing chamber made to achieve a higher pressure than the pressure set for the first processing step, voltage application control is executed for the member based upon second processing voltage application information set and stored in the setting information storage means while the specific gas is supplied into the processing chamber via the gas supply system and the processing chamber is evacuated by the evacuation system.

According to the present invention described above, through the voltage application control executed in the first processing step and the second processing step to control the voltage application to the member disposed inside the processing chamber, particles having settled on the member, for instance, are lifted off and scattered so that the particles are lifted into the gas flow inside the processing chamber to be discharged from the processing chamber. The present invention allows the first processing step and the second processing step to be executed at the optimal voltage settings that may be different from each other, in correspondence to the specific structure adopted in the processing chamber. As a result, the optimal cleaning processing for the particular processing chamber can be executed while preventing an abnormal electrical discharge from occurring as the processing chamber is cleaned. In other words, the processing chamber cleaning processing according to the present invention may be adopted when cleaning processing chambers adopting various structures.

The object described above is achieved in a still further aspect of the present invention by providing a method for cleaning a substrate processing apparatus that includes a plurality of processing chambers in each of which a specific type of processing is executed on a substrate to be processed, to be adopted to clean the inside of each processing chamber. The substrate processing apparatus cleaning method comprises a first processing step in which, with first processing voltage application information set for each of the processing chambers and second processing voltage application information set for each of the processing chambers both stored in a setting information storage means, voltage application control is executed to control voltage application to a member disposed inside a specific processing chamber to be cleaned among the plurality of processing chambers, based upon the first processing voltage application information for the particular processing chamber obtained from the setting information storage means with the processing chamber sustaining therein a low-pressure environment as a specific gas is supplied into the processing chamber via a gas supply system and the processing chamber is evacuated by an evacuation system, and a second processing step in which with the atmosphere inside the processing chamber achieving a higher pressure than the pressure set for the first processing step, voltage application control is executed to control the voltage application to the member based upon the second processing voltage application information for the processing chamber obtained from the setting information storage means as the specific gas is supplied into the processing chamber via the gas supply system and the processing chamber is evacuated by the evacuation system.

The object described above is achieved in yet another aspect of the present invention by providing a substrate processing apparatus that includes a plurality of processing chambers where a specific type of processing is executed on substrates to be processed and is capable of cleaning the inside of the individual processing chambers. The substrate processing apparatus comprises a setting information storage means at which first processing voltage application information set for each of the processing chambers and second processing voltage application information set for each of the processing chambers are stored, and a control unit that executes first processing whereby voltage application control is executed to control voltage application to a member disposed inside a specific processing chamber to be cleaned among the plurality of processing chambers, based upon the first processing voltage application information for the particular processing chamber obtained from the setting information storage means, with the processing chamber sustaining therein a low-pressure environment as a specific gas is supplied into the processing chamber via a gas supply system and the processing chamber is evacuated by an evacuation system, and second processing whereby voltage application control is executed to control the voltage application to the member based upon the second processing voltage application information for the processing chamber obtained from the setting information storage means with the atmosphere within the processing chamber achieving a higher pressure than the pressure set for the first processing as the specific gas is supplied into the processing chamber via the gas supply system and the processing chamber is evacuated by the evacuation system.

According to the present invention described above, each of the plurality of processing chambers in the substrate processing apparatus can be cleaned by setting optimal voltages for the first processing and the second processing, which may be different from each other, in correspondence to the particular structure adopted in the processing chamber. Thus, optimal cleaning processing for each processing chamber can be executed while preventing an abnormal electrical discharge from occurring while the processing chamber undergoes the cleaning processing.

It is to be noted that the first processing voltage application information and the second processing voltage application information may each include voltage information needed to execute voltage control whereby the voltage applied to the member is altered. In this case, particles can be lifted off and scattered even more effectively.

In addition, prior to the first processing step, a step is to be executed in which a decision is made based upon first processing GO/NO GO setting information stored in the setting information storage means as to whether or not the first processing step may be executed and, if it is decided that the first processing step is to be executed, the first processing step should be executed first, before executing the second processing step, whereas if the first processing step is not to be executed, the second processing step alone should be executed. Since this allows the second processing alone to be executed without executing the first processing in a processing chamber where an abnormal electrical discharge occurs during the first processing, optimal cleaning processing can be executed for the particular processing chamber.

The discharge system may include an auxiliary pump with which the pressure inside the processing chamber is reduced through roughing and a main pump with which the processing chamber is evacuated to reduce the pressure therein to a level lower than a predetermined level. In conjunction with such an evacuation system, the voltage application control for the member may be executed during the first processing step as the specific gas is supplied via the gas supply system and the processing chamber is evacuated by the main pump, supply of the specific gas via the gas supply system may be stopped once the voltage application control ends and the pressure within the processing chamber may be reduced by the main pump at least to a predetermined level of vacuum. The second processing step may be executed by controlling the voltage application to the member as the specific gas is supplied via the gas supply system and the processing chamber is evacuated with the auxiliary pump, stopping the supply of the specific gas via the gas supply system once the voltage application control ends, continuously evacuating the processing chamber with the auxiliary pump until the pressure inside the processing chamber reaches the predetermined level and reducing the pressure inside the processing chamber with the main pump until it is lowered to at least to the predetermined level of vacuum. In this case, following the voltage application control for the member during the second processing step, the auxiliary pump is continuously engaged in operation to evacuate the processing chamber until the pressure therein reaches a predetermined level at which the pressure can be further reduced with the main pump. As a result, the length of time required to execute the second processing can be reduced. This advantage is particularly significant when the second processing must be executed repeatedly.

Once the voltage application control for the member ends during the first processing step, the main pump may be engaged in operation to evacuate both the processing chamber and the gas supply system until the predetermined level of vacuum is achieved, and once the voltage application control for the member ends during the second processing step, the processing chamber alone may be evacuated using both the main pump and the auxiliary pump until the predetermined level of vacuum is achieved. In this case, since the evacuation of the gas supply system, which is not necessary for the second processing, is skipped, the length of time required to execute the second processing is further reduced.

BRIEF DESCRIPTION OF THE DRAWINGS

FIG. 5 presents a specific example of a data table holding GO/NO GO setting information for the first particle reduction processing;

FIG. 6A presents a specific example of data table holding voltage application information to be used in conjunction with the first particle reduction processing;

FIG. 6B presents a specific example of data table holding voltage application information to be used in conjunction with the second particle reduction processing;

DETAILED DESCRIPTION OF THE PREFERRED EMBODIMENT

Figure 1:
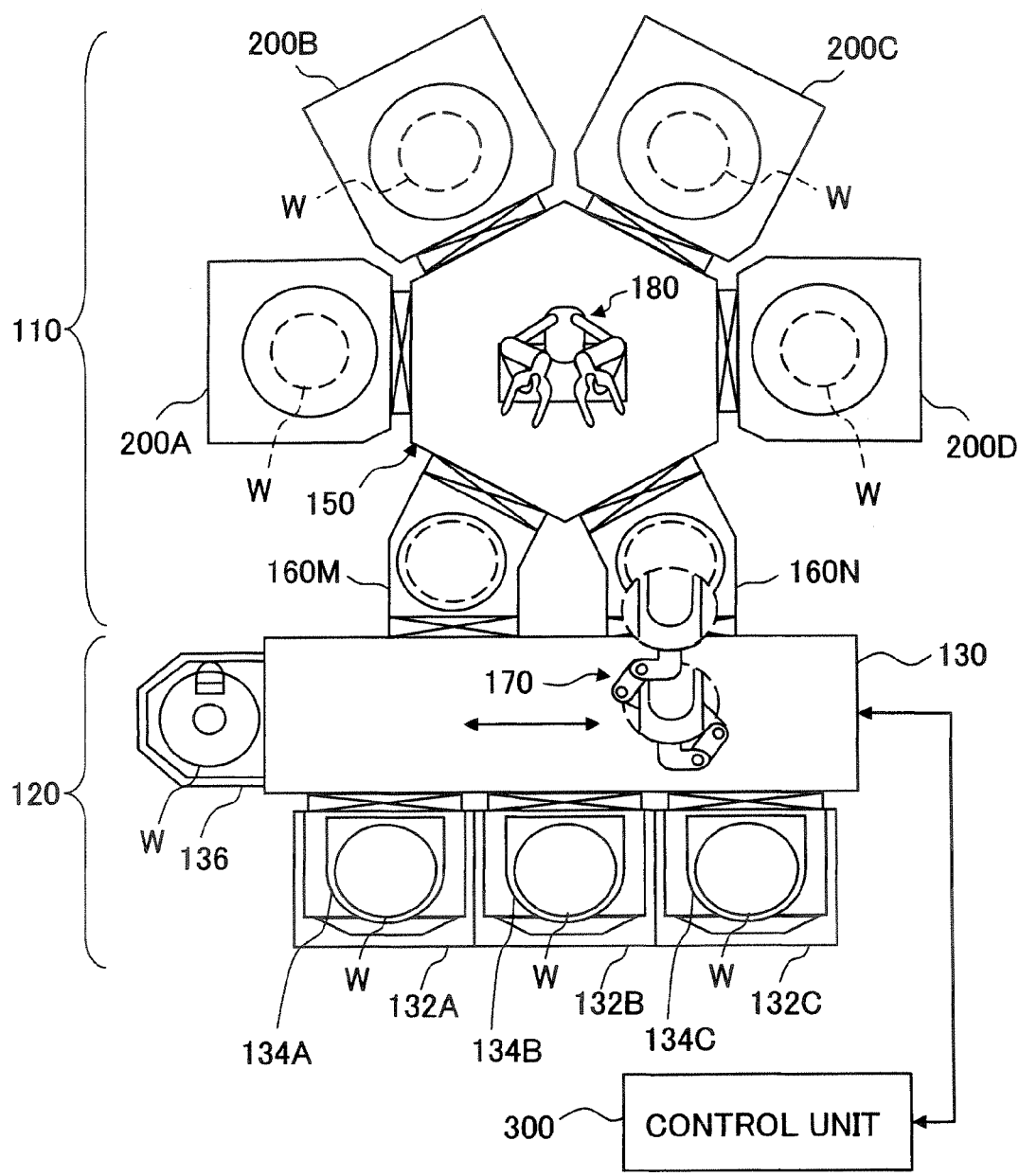
FIG. 1 is a sectional view showing the structure adopted in the substrate processing apparatus achieved in an embodiment of the present invention.

The following is a detailed explanation of a preferred embodiment of the present invention, given in reference to the attached drawings. It is to be noted that in the specification and the drawings, the same reference numerals are assigned to components having substantially identical functions and structural features to preclude the necessity for a repeated explanation thereof.

(Example of Structure that May be Adopted in Substrate Processing Apparatus)

First, the substrate processing apparatus achieved in an embodiment of the present invention is explained in reference to drawings. FIG. 1 schematically shows the structure adopted in the substrate processing apparatus in the embodiment of the present invention. The substrate processing apparatus 100 comprises a processing unit 110 where various types of processing such as film formation and etching are executed on substrates which may be, for instance, semiconductor wafers (hereafter may be simply referred to as "wafers") W and a transfer unit 120 that transfers the wafers W to/from the processing unit 110.

First, an example of a structure that may be adopted in the transfer unit 120 is explained. As shown in FIG. 1, the transfer unit 120 includes a transfer chamber 130 through which wafers are transferred between substrate storage containers such as cassette containers 132 (132A through 132C) to be detailed later and the processing unit 110. The transfer chamber 130 is formed as a box with a substantially polygonal section (e.g., a rectangular section). On one side of the transfer chamber 130, a plurality of cassette stages 131 (131A through 131C) are disposed side-by-side. The cassette containers 132A through 132C representing an example of substrate storage containers can be placed on the cassette stages 131A through 131C respectively.

The cassette containers 132 (132A through 132C) each have a capacity for holding up to, for instance, 25 wafers W stacked with uniform pitches. The cassette containers adopt a sealed structure with their inner space filled with, for instance, an $N_2$ gas atmosphere. The wafers W can be transferred between the transfer chamber 130 and the cassette containers via gate valves. It is to be noted that the numbers of the cassette stages 131 and the cassette containers 132 are not limited to those shown in FIG. 1.

An orienter (pre-alignment stage) 136 to function as a positioning device is disposed at an end of the transfer chamber 130. This orienter 136 aligns a wafer W by detecting an orientation flat, a notch or the like in the wafer W.

Inside the transfer chamber 130, a transfer unit-side transfer mechanism (transfer chamber internal transfer mechanism) 170 that transfers a wafer W along the longer side of the transfer chamber (along the direction indicated by the arrow in FIG. 1) via, for instance, a linear drive mechanism is disposed. The transfer unit-side transfer mechanism 170 is driven based upon a control signal provided by a control unit 300. It is to be noted that the transfer unit-side transfer mechanism 170 may be a double-arm mechanism with two end effectors such as that shown in FIG. 1, or it may be a single-arm mechanism with a single end effector.

Next, an example of a structure that may be adopted in the processing unit 110 is explained. The processing unit 110 in, for instance, a cluster tool-type substrate processing apparatus may include a plurality of processing chambers 200 (first through fourth processing chambers 200A through 200D) and load-lock chambers 160M and 160N, all connected around a common transfer chamber 150 formed so as to have a polygonal section (e.g., a hexagonal section), as shown in FIG. 1, with a high level of airtightness.

In each of the processing chambers 200A through 200D, a specific type of processing such as film formation processing (e.g., plasma CVD processing) or etching (e.g. plasma etching processing) is executed on a wafer W. Gas supply systems (not shown in FIG. 1) through which specific types of gases to be used as a processing gas and a purge gas can be supplied into the individual processing chambers 200A through 200D and discharge systems (not shown in FIG. 1) through which the gasses in the processing chambers 200A through 200D can be discharged are connected to the processing chambers 200A through 200D. It is to be noted that a structural example that may be adopted in the processing chambers 200A through 200D is to be described in detail later. In addition, the number of processing chambers 200 in the substrate processing apparatus is not limited to that in the example shown in FIG. 1.

The common transfer chamber 150 has a function of transferring wafers W between the individual processing chambers 200A through 200D described above and/or between the processing chambers 200A through 200D and the first and second load-lock chambers 160M and 160N. The common transfer chamber 150 assumes a polygonal shape (e.g., a hexagonal shape). The processing chambers 200 (200A through 200D), which are disposed around the common transfer chamber, are each connected with the common transfer chamber via a gate valve and the front ends of the first and second load-lock chambers 160M and 160N are each connected with the common transfer chamber via a gate valve (a vacuum pressure-side gate valve). The base ends of the first and second load-lock chambers 160M and 160N are connected to the other side surface of the transfer chamber 130 each via a gate valve (an atmospheric pressure-side gate valve).

The first and second load-lock chambers 160M and 160N have a function of temporarily holding wafers W and passing them onto subsequent processing phases after pressure adjustment. Inside each of the first and second load-lock chambers 160M and 160N, a transfer stage on which a wafer can be placed is disposed.

At the processing unit 110 structured as described above, the passages between the common transfer chamber 150 and the individual processing chambers 200A through 200D and the passages between the common transfer chamber 150 and the individual load-lock chambers 160M and 160N can be opened/closed while assuring a high level of airtightness, thereby achieving a cluster-tool structure that allows communication with the common transfer chamber 150 as necessary. In addition, the passages between the transfer chamber 130 and the first and second load-lock chambers 160M and 160N, too, can be opened/closed while assuring airtightness.

Inside the common transfer chamber 150, a processing unit-side transfer mechanism (common transfer chamber internal transfer mechanism) 180 constituted with articulated arms capable of flexing, moving up/down and rotating, for instance, is disposed. This processing unit-side transfer mechanism is used to transfer wafers W from the load-lock chambers 160M and 160N to the individual processing chambers 200A through 200D and vice versa. The processing unit-side transfer mechanism 180 is driven based upon a control signal provided by the control unit 300. It is to be noted that the processing unit-side transfer mechanism 180 may be a double-arm mechanism with two end effectors such as that shown in FIG. 1, or it may be a single-arm mechanism with a single end effector.

The substrate processing apparatus 100 includes the control unit 300 that controls the overall operations of the substrate processing apparatus including control of the transfer unit-side transfer mechanism 170, the processing unit-side transfer mechanism 180, the various gate valves and the orienter 136. An example of a structure that may be adopted in such a control unit 300 is explained later.

As the substrate processing apparatus 100 structured as described above is engaged in operation, processing on wafers W starts. For instance, a wafer W taken out of one of the cassette containers 132A through 132C by the transfer unit-side transfer mechanism 170 is then carried over to the orienter 136. After undergoing alignment at the orienter 136, the wafer W is carried out of the orienter 136 and is moved into either the load-lock chamber 160M or the load-lock chamber 160N. If a processed wafer W having undergone all the required processing is present in the load-lock chamber 160M or 160N at this time, the unprocessed wafer W is carried into the load-lock chamber after carrying out the processed wafer W.

The wafer having been carried into the load-lock chamber 160M or 160N is transferred out of the load-lock chamber 160M or 160N by the processing unit-side transfer mechanism 180, and is transferred into the processing chamber 200 where it is to undergo the specific type of processing. Once the processing is completed in the processing chamber 200, the processed wafer is transferred out of the processing chamber 200 by the processing unit-side transfer mechanism 180. If the wafer W needs to undergo continuous processing at a plurality of processing chambers 200, the wafer is carried into another processing chamber 200 to undergo the next phase of processing.

Ultimately, the processed wafer having undergone all the required processing is carried back into the load-lock chamber 160M or 160N. The processed wafer W having been moved back into the load-lock chamber 160M or 160N is then taken back into the initial cassette container among the cassette containers 132A through 132C by the transfer unit-side transfer mechanism 170.

(Structural Example for Processing Chambers)

Figure 2:
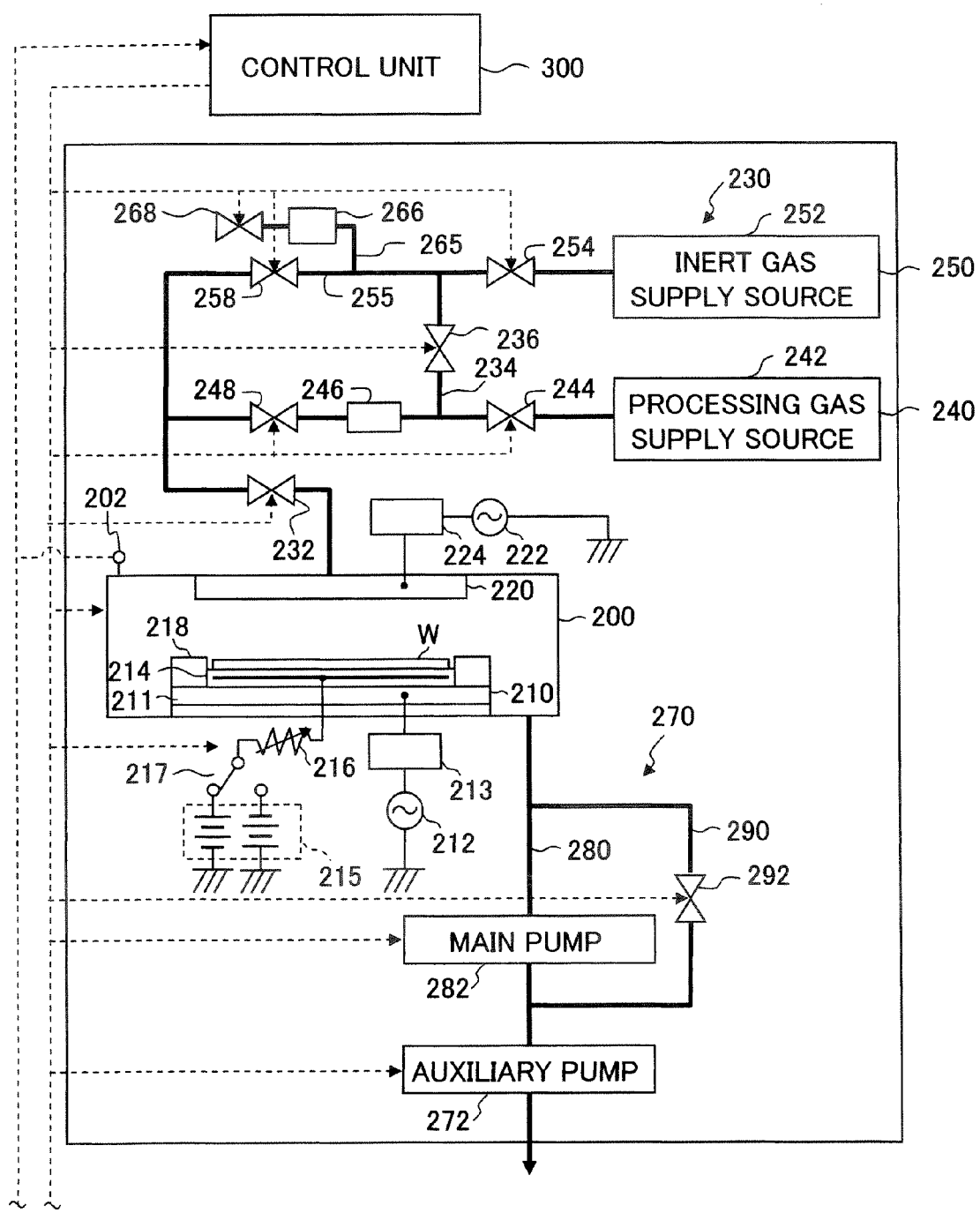
FIG. 2 shows a structural example that may be adopted in the processing chamber in FIG. 1.

In reference to a drawing, an example of a structure that may be adopted in the processing chambers 200A through 200D is explained. FIG. 2 presents a block diagram of a structural example that may be adopted in the processing chambers 200A through 200D. It is assumed that the processing chambers 200A through 200D adopt structures identical to one another and the explanation is given on a representative processing chamber 200 without attaching a letter A, B, C or D to reference numerals for the components so as to avoid reference to any specific processing chamber among the processing chambers 200A through 200D. In other words, the processing chamber 200 may be any of the processing chambers 200A through 200D.

As shown in FIG. 2, a stage 210 on which the wafer W is placed is disposed inside the processing chamber 200. A lower electrode 211 is built into the stage 210 and a high-frequency power source 212 that functions as a bias power source is connected to the lower electrode 211 via a matcher 213.

An electrostatic chuck 214, representing an example of an electrostatic holding means for holding the wafer W with an electrostatic attracting force, is disposed on the stage 210. An electrode plate built into the electrostatic chuck 214 is electrically connected via a variable resistor 216 and a switch to a DC power source 215 from which either a positive voltage or a negative voltage can be selectively applied. The surface of the stage 210 is coated with, for instance, alumina or polyimide, and as a positive DC voltage, for instance, is applied from the DC power source 215, the wafer W becomes attracted to and held onto the surface of the stage 210.

The variable resistor 216 and the switch 217 are controlled by the control unit 300. The control unit 300 controls the level of a positive voltage or the negative voltage applied to the electrostatic chuck 214 by, for instance, adjusting the resistance value at the variable resistor 216, and the control unit 300 is able to switch from the positive voltage application to the negative voltage application and vice versa by switching the setting at the switch 217. Such control of the voltage applied to the electrostatic chuck 214 is executed during the cleaning processing to be detailed later.

It is to be noted that the electrostatic chuck 214 may adopt a structure other than that shown in FIG. 2. A focus ring 218 is disposed at the edge of the upper surface of the electrostatic chuck 214 so as to enclose the wafer W.

An upper electrode 220 is disposed inside the processing chamber 200 so as to face opposite the stage 210. A high-frequency power source 222, to function as a plasma excitation power source, is connected to the upper electrode 220 via a matcher 224. The upper electrode 220 also constitutes a shower head through which a gas originating from a gas supply system 230 is drawn into the processing chamber 200. More specifically, a plurality of gas intake holes (not shown) are formed at the upper electrode 220 and the gas is taken in through the gas intake holes toward the wafer W set on the stage 210.

A pressure sensor that detects the pressure inside the processing chamber 200 is installed at the processing chamber 200. Based upon the pressure reading provided by the pressure sensor 202 constituted with, for instance, a diaphragm gauge (e.g., a capacitance manometer), the processing chamber internal pressure is controlled.

In addition, in conjunction with the processing chamber 200, the gas supply system 230 through which a specific gas such as a processing gas, a purge gas or the like is supplied into the processing chamber 200 and an evacuation system 270 through which the processing chamber 200 is evacuated are provided.

The gas drawn into the processing chamber 200 via the gas supply system 230 may be a processing gas such as $CF_4$, $C_2F_8$, $NF_3$, $SF_6$, $NH_3$, $NO_X$, hydrogen halide or a heavy-metal alkoxide complex containing hazardous components or it may be an inert gas used as a purge gas or a pressure adjusting gas. The term "inert gas" is used in the description to broadly refer to a gas that does not induce a chemical change readily and, such an inert gas may be $N_2$ gas, as well as any of the rare gas elements such as Ar and He. It is to be noted that according to the present invention, an inert gas is utilized when cleaning the processing chamber, as explained later.

The gas supply system 230 includes a processing gas supply system 240 and an inert gas supply system 250 as shown in FIG. 2. In the embodiment, the inert gas supply system 250 is engaged when cleaning the inside of the processing chamber 200 (e.g., when executing the two-phase particle reduction processing to be detailed later). It is to be noted that the inert gas supply system 250 is also utilized as an atmospheric pressure setting system by which the pressure inside the processing chamber 200 is reduced to the atmospheric pressure level by drawing in an inert gas (e.g., $N_2$ gas) in addition to being utilized when cleaning the inside of the processing chamber 200.

A specific structure that may be adopted in the gas supply system 230 is described below. The gas supply system 230 assumes a structure in which the pipings for the processing gas supply system 240 and the inert gas supply system 250 join each other and connect as one to the processing chamber 200 via a main valve 232. The processing gas supply system 240 may include, for instance, a processing gas supply source 242, an upstream-side gas supply valve 244, a flow regulator (e.g., a mass flow controller) 246 and a downstream-side gas supply valve 248. It is to be noted that a piping structure in which a plurality of processing gas supply systems 240, each corresponding to a specific processing gas constituent, are disposed in parallel and the individual processing gas constituents join one another so that they are supplied into the processing chamber 200 as the processing gas, may be adopted.

The inert gas supply system 250 may include, for instance, an inert gas supply source 252 and an upstream-side gas supply valve 254. Such an inert gas supply system may be achieved by connecting in parallel a low flow rate supply system (first supply system) 265 through which the inert gas from the inert gas supply source 252 can be supplied into the processing chamber 200 at a specific low flow rate and a high flow rate supply system (second supply system) 255 through which the inert gas from the inert gas supply source 252 can be supplied into the processing chamber 200 at a higher flow rate than the flow rate at which the inert gas is supplied via the low flow rate supply system 265, both to the downstream side of the upstream-side gas supply valve 254.

The low flow rate gas supply system 265 includes a restrictor valve 266 through which the flow rate of the inert gas originating from the inert gas supply source 252 is adjusted at a specific level and a downstream-side gas supply valve 268. The restrictor valve 266 may be a fixed valve such as, for instance, an orifice or a choke, or it may be a variable valve that allows fine adjustment of the flow rate. In addition, the restrictor valve 266 and the downstream-side gas supply valve 268 may be constituted with a common orifice valve. The high flow rate supply system 255 is connected to the downstream side of the low flow rate supply system 265 via a downstream-side gas supply valve 258.

The processing gas supply system 240 and the inert gas supply system 250 are connected with each other via a communicating pipe 234. More specifically, the downstream side of the upstream-side gas supply valve 244 at the processing gas supply system 240 and the downstream side of the upstream-side gas supply valve 254 at the inert gas supply system 250 are connected with each other via the communicating pipe 234 which includes a communicating valve 236. As the communicating valve 236 is opened, the inert gas from the inert gas supply system 250 is drawn into the processing chamber 200 via the communicating pipe 234, the flow regulator 246 and the downstream-side gas supply valve 248 at the processing gas supply system 240, and the main valve 232. Thus, the inert gas from the inert gas supply system 250 can be drawn into the processing chamber 200 as its flow rate is adjusted at the flow regulator 246 in the processing gas supply system 240.

The discharge system 270 may be constituted by, for instance, connecting in parallel a main discharge system 280 and an auxiliary discharge system 290 to the processing chamber 200. The main discharge system 280 and the auxiliary discharge system 290 join each other on the discharge side and are together connected to an auxiliary pump 272. A main pump 282 is connected to the main discharge system 280, whereas a switch-over valve (switching valve, auxiliary valve) 292 used to switch between discharge through the main discharge system 280 and discharge through the auxiliary discharge system 290 is connected to the auxiliary discharge system 290. It is to be noted that the main pump 282 connected to the main discharge system 280 is connected with the processing chamber 200 via a pressure adjusting valve (e.g., an APC valve: adaptive pressure controller valve) (not shown).

The auxiliary pump 272 may be a dry pump with which roughing vacuum processing is executed to evacuate the processing chamber 200 to a state of vacuum achieving a specific pressure. The main pump 282 may be, for instance, a turbopump with which main evacuation processing is executed to further evacuate the processing chamber 200 until a desired vacuum is achieved. This discharge system 270 may be connected to, for instance, a discharge facility at the plant. It is to be noted that the evacuation system 270 may assume a structure other than that shown in FIG. 2.

The various valves in the gas supply system 230 and the evacuation system 270 are each controlled based upon a control signal provided by the control unit 300. In addition, the output from the pressure sensor 202 is provided to the control unit 300.

(Example of Operations in Processing Chamber)

Before processing a wafer W in the processing chamber 200 structured as described above, evacuation processing is first executed with the gate valve at the processing chamber 200 kept in a closed state so as to reduce the pressure inside the processing chamber 200 to a predetermined level. During the evacuation processing, the pressure inside the processing chamber is first lowered to a specific level through the roughing vacuum processing and then the pressure at the specific level may be further lowered to a level having been set to achieve a high level of vacuum through main evacuation processing.

More specifically, the roughing vacuum processing is first executed by opening the switch-over valve 292 so as to select the auxiliary discharge system 290 in the evacuation system 270 and driving the auxiliary pump 272. Then, once the pressure inside the processing chamber detected by the pressure sensor 202 is lowered to the specific level, the switch-over valve 292 is closed to select the main discharge system 280 in the evacuation system 270 and the main evacuation processing is executed by driving the main pump 282 until the pressure detected by the pressure sensor 202 is lowered to the preset level.

Once the main evacuation processing is completed, the gate valve is opened and the wafer W is carried into the processing chamber 200. After the wafer W is placed on the stage, the gate valve is closed and the operation shifts to the phase for processing the wafer W. Namely, the wafer W is processed over a predetermined length of time while the pressure inside the processing chamber 200 is sustained at the predetermined level by monitoring the pressure detected by the pressure sensor 202.

More specifically, high-frequency power at predetermined levels is individually applied to the upper electrode 220 and the lower electrode 211 and with the main discharge system 280 selected in the evacuation system 270 by closing the switch-over valve 292, the gas supply valves 244 and 288 and the main valve 232 are opened so as to draw the processing gas from the processing gas supply source 242 into the processing chamber 200. As a result, the processing gas from the gas supply system 230 is evenly delivered toward the wafer W via the upper electrode 220. The processing gas having been drawn in through the upper electrode 220 is raised to plasma with which the surface of the wafer W is processed, e.g., etched.

The wafer W is processed in the processing chamber 200 as described above based upon wafer processing information such as a process recipe indicating the processing steps and the like, which is stored in advance at, for instance, a recipe data storage means in the control unit 300. The contents of the wafer processing information vary depending upon the type of wafer processing, the processing conditions and the like.

Once the wafer W is processed, the gas supply valve 244 is closed, carryover discharge of the processing chamber 200 is executed via the main discharge system 202 and the processed wafer W is carried out of the processing chamber 200. The processing of the particular wafer W thus ends. Subsequently, a next wafer W is carried into the processing chamber 200. Namely, wafers W are sequentially processed one at a time through the procedure described above. The discharge gas discharged through the evacuation system 270 of the processing chamber 200 as wafers W are processed as described above is directed into the discharge facility at the plant. It is to be noted that if the exhaust gas discharged via the evacuation system 270 contains a harmful substance, the exhaust gas may be directed into the discharge facility at the plant via a scrubber that removes such harmful substances.

As wafer processing such as etching or film formation processing is executed in the processing chamber 200 structured as described above, particles (fine particles of foreign matter) are generated in the processing chamber 200. In order to remove such particles from the processing chamber, the inside of the processing chamber 200 is cleaned over predetermined intervals.

The cleaning processing executed to clean the inside of the processing chamber is two-phase particle reduction processing (also referred to as NPPC: non-plasma particle cleaning) that includes first particle reduction processing (first processing) executed by setting the pressure inside the processing chamber 200 at a low level and second particle reduction processing (second processing) executed by setting the pressure inside the processing chamber 200 at a high level.

During the first particle reduction processing, the pressure inside the processing chamber is set to a low level, which may substantially match the pressure level at which the wafer processing is executed. By controlling the voltage applied to the electrostatic chuck 214 in such a low-pressure environment, particles can be peeled or lifted off and scattered more efficiently with maxwell stress or the like.

During the second particle reduction processing executed next, the pressure inside the processing chamber is set higher than the pressure level selected for the first particle reduction processing. In such a high-pressure environment, the particles having become lifted off and scattered by controlling the voltage applied to the electrostatic chuck 214 are allowed to flow in the gas and are thus discharged with higher efficiency.

Through the two-phase particle reduction processing executed as described above to clean the inside of the processing chamber, the particles present within the processing chamber can be lifted off and scattered and discharged efficiently.

However, it was learned by executing the two-phase particle reduction processing in processing chambers assuming various structures that an abnormal electrical discharge (e.g., an arc discharge) sometimes occurred in a processing chamber depending upon the particulars of the structure adopted therein. For instance, an abnormal electrical discharge occurred in a processing chamber during the first particle reduction processing when a voltage substantially equal to the voltage applied to the electrostatic chuck 214 during the second particle reduction processing was applied to the electrostatic chuck 214.

Figure 3:
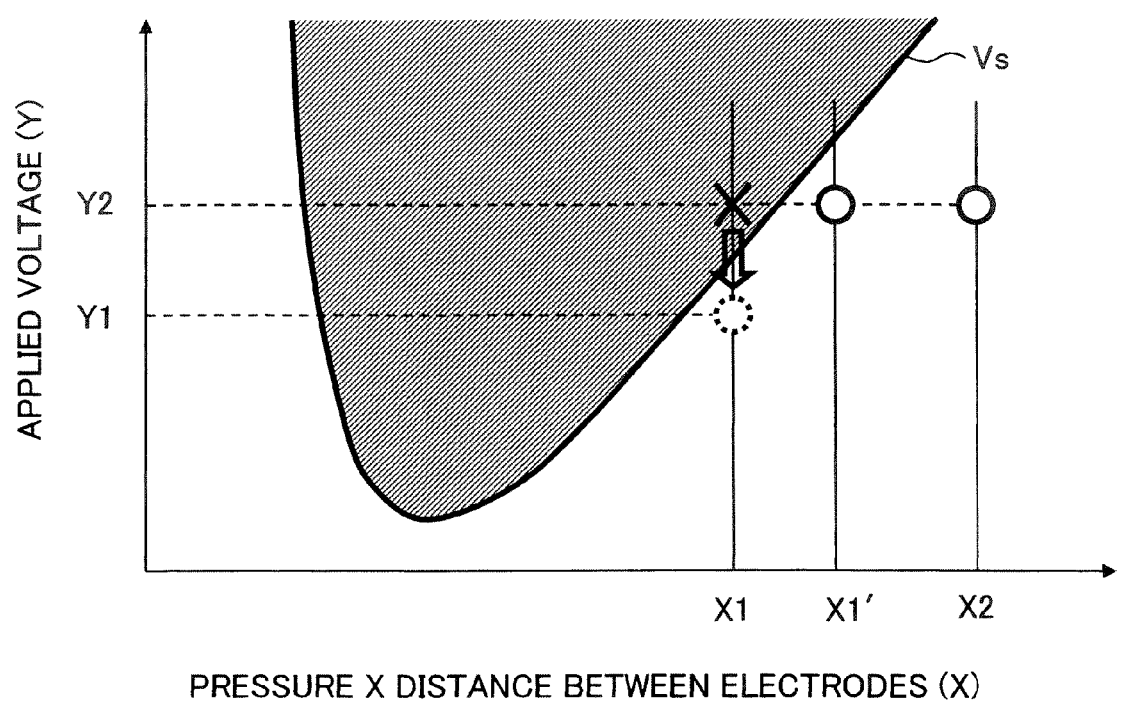
FIG. 3 shows the relationship between the voltage applied to the electrostatic chuck and the electrical discharge.

For instance, it is assumed that Paschen's Law is applicable to the relationship between the voltage applied to the electrostatic chuck 214 and the electrical discharge observed in a processing chamber 200 having disposed therein an upper electrode 220 and a lower electrode 211, as shown in FIG. 2. According to Paschen's Law, an electrical discharge start voltage Vs is expressed as a function of the product pd of the gas pressure p within the processing chamber 200 (processing chamber internal pressure) and the distance d between the upper electrode 220 and the lower electrode 211 and the electrical discharge start voltage Vs takes a minimal value when pd assumes a specific value, FIG. 3 shows a graph of the electrical discharge start voltage Vs that takes specific values in conformance to Paschen's Law. In FIG. 3, the product (pressure×distance between electrodes) (X) is indicated along the horizontal axis and the voltage (Y) applied to the electrostatic chuck 214 is indicated along the vertical axis. As FIG. 3 indicates, the electrical discharge start voltage Vs is expressed as a downward pointing curve, which means that an electrical discharge occurs over the range above the curve (the shaded area). The graph indicates that a discharge tends to occur readily even if the voltage (Y) applied to the electrostatic chuck is low in the vicinity of the minimal electrical discharge start voltage value and once the electrical discharge start voltage Vs passes the minimal value point, an electrical discharge occurs less readily even at a high voltage (Y) as the product (pressure×distance between electrodes) (X) increases. It is to be noted that the same principle applies to a negative voltage applied to the electrostatic chuck and, in this case, the absolute value of the voltage represents the voltage (Y).

The value of the product (pressure×distance between electrodes) (X) may vary depending upon the structure adopted in the particular processing chamber, and for this reason, an abnormal electrical discharge may occur depending upon the processing chamber structure even when cleaning processing is executed under identical voltage application conditions and the like.

For instance, let us now assume that when a given voltage $Y_2$ is applied to the electrostatic chuck 214 both during the first particle reduction processing and during the second particle reduction processing, the products (pressure×distance between electrodes) (X) corresponding to the first particle reduction processing and the second particle reduction processing, calculated for a first processing chamber, are $X_1$ and $X_2$ respectively and the products (pressure×distance between electrodes) (X), corresponding to the first particle reduction processing and the second particle reduction processing, calculated for a second processing chamber, are $X_1'$ and $X_2$ respectively.

In this case, neither the product $X_1'$ or the product $X_2$ calculated for the second processing chamber at the voltage $Y_2$ is contained in the shaded area in the graph of the electrical discharge start voltage Vs and thus, no discharge occurs in the second processing chamber. However, the product $X_1$ calculated for the first processing chamber at the voltage $Y_2$ is contained in the shaded area in the graph of the electrical discharge start voltage Vs, indicating that a discharge may occur in the first processing chamber during the first particle reduction processing. Under such circumstances, the occurrence of an electrical discharge can be prevented both during the first particle reduction processing and during the second particle reduction processing by lowering the voltage applied to the electrostatic chuck during the first particle reduction processing to $Y_1$.

Accordingly, the present invention allows different settings to be selected for the voltage to be applied to the electrostatic chuck 214 during the first particle reduction processing and the second particle reduction processing and also makes it optional as to whether or not the first particle reduction processing is to be executed. Since this allows the optimal settings to be selected for the specific structure assumed in the processing chamber, it becomes possible to execute optimal cleaning processing regardless of the particulars of the structure adopted in the processing chamber while preventing the occurrence of an abnormal electrical discharge.

(Example of Structure Adopted in Control Unit that Executes Cleaning Processing)

Figure 4:
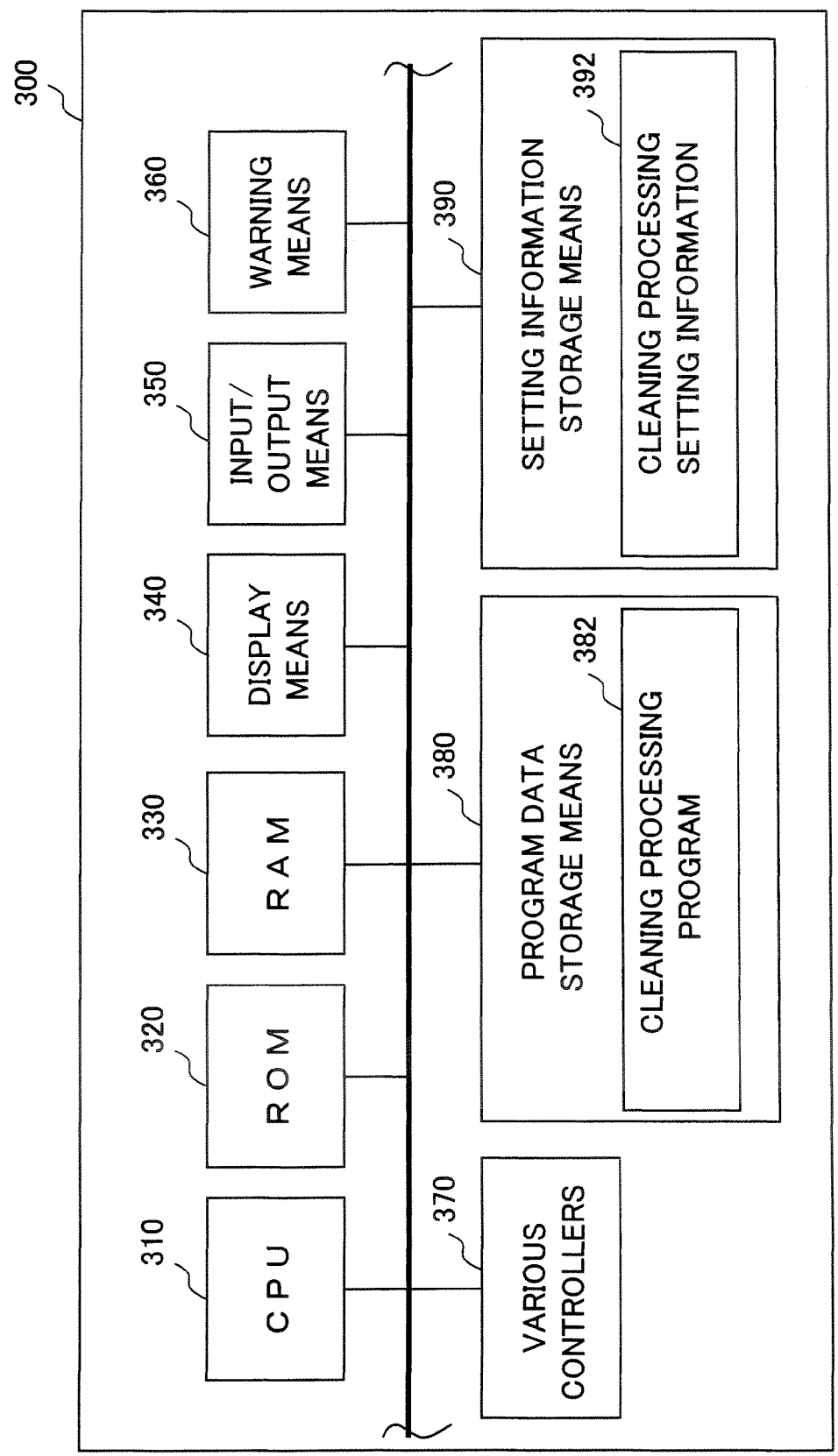
FIG. 4 is a block diagram of the structure adopted in the control unit in the embodiment.

Next, the control unit that executes the cleaning processing described above is explained. Since such cleaning processing may be executed at, for instance, the control unit 300 that controls the substrate processing apparatus 100, a specific example of a structure that may be adopted in the control unit 300 is explained below in reference to FIG. 4.

The control unit 300 comprises a CPU (central processing unit) 310 constituting the control unit main body, a ROM (read only memory) 320 having stored therein data and the like to be used by the CPU 310 to control the various units, a RAM (random access memory) 330 that includes a memory area used by the CPU 310 when it executes various types of data processing, a display means 340 constituted with a liquid crystal display or the like at which an operation screen or a selection screen is brought up on display, an input/output means 350 that allows an operator to input/output various types of data, a warning means 360 constituted with, for instance, an alarm such as a buzzer, various controllers 370 used to control the various units constituting the substrate processing apparatus 100, a program data storage means 380 having stored therein program data based upon which processing is executed in the substrate processing apparatus 100 and a setting information storage means 390 having stored therein various types of setting information including recipe information to be used when executing the processing based upon the program data. The program data storage means 380 and the setting information storage means 390 may each be constituted with a recording medium such as a memory, a hard disk or a CD-ROM. The CPU 310 reads out the data from the recording medium whenever necessary and uses the data thus read out.

The CPU 310, the ROM 320, the RAM 330, the display means 340, the input/output means 350, the warning means 360, the various controllers 370, the program data storage means 380 and the setting information storage means 390 are electrically connected via a bus line such as a control bus, a system bus or a data bus.

The various controllers 370 include controllers that control the units constituting the individual processing chambers 200A through 200D, e.g., controllers that control the individual valves and pumps at the gas supply systems 230 and the evacuation systems 270, controllers that control the high-frequency power sources and controllers that control the voltage applied to the individual electrostatic chucks 214, as well as controllers for the transfer mechanisms 170 and 180 and the orienter 136. It is to be noted that the various units constituting each of the processing chambers 200A through 200D may instead be controlled by a dedicated control unit provided in conjunction with each processing chamber 200A through 200D. In such a case, the control unit 300 should be connected with the individual control units serving the respective processing chambers 200A through 200D so as to control the substrate processing apparatus 100 by exchanging data and signals.

At the program data storage means 380, a wafer processing program and the like are stored in addition to a cleaning processing program 382. At the setting information storage means 390, wafer processing setting information constituted with recipe data indicating the processing chamber internal pressure settings, gas flow rates, the high-frequency power levels to be used when controlling the individual units during the wafer processing and the like, is stored in addition to cleaning processing setting information 392 constituted with recipe data indicating, for instance, the voltage to be applied while controlling the individual units during the cleaning processing.

The cleaning processing setting information 392 includes setting information indicating the settings to be selected when executing the two-phase particle reduction processing described earlier as cleaning processing. Such setting information includes GO/NO GO setting information (first processing GO/NO GO setting information) related to the first particle reduction processing, based upon which either a GO setting or a NO GO setting indicating the first particle reduction processing is to be executed or not during the cleaning processing is selected, voltage application information (first processing voltage application information) based upon which the voltage applied to a member disposed inside the processing chamber, e.g., the electrostatic chuck 214, is controlled during the first particle reduction processing and voltage application information (second processing voltage application information) based upon which the voltage applied to the electrostatic chuck 214 is controlled during the second particle reduction processing.

The first particle reduction processing GO/NO GO setting information may be constituted with a data table such as that shown in FIG. 5. In the data table in FIG. 5, a setting indicating whether or not the first particle reduction processing is to be executed can be individually selected for the processing chambers (the first processing chamber 200A the fourth processing chamber 200D). It is to be noted that the first particle reduction processing GO/NO GO setting information may be set through an operator operation at, for instance, the input/output means 350 described earlier, or it may be set based upon specific data received as necessary from a host apparatus connected to the control unit 300 via a network.

The voltage application information for the first particle reduction processing may be constituted with a data table such as that shown in FIG. 6A, whereas the voltage application information for the second particle reduction processing may be constituted with a data table such as that shown in FIG. 6B. The data tables in FIGS. 6A and 6B each allow the voltage application information to be set in correspondence to the individual processing chambers (the first processing chamber 200A to the fourth processing chamber 200D. It is to be noted that the voltage application information for the first particle reduction processing and the second particle reduction processing may be set through an operator operation at, for instance, the input/output means 350, or it may be set by receiving necessary data from a host apparatus connected to the control unit 300 via a network.

The voltage application information in FIGS. 6A and 6B is setting information used to execute voltage application control for, for instance, altering the voltage being applied. In the data tables in FIGS. 6A and 6B, for instance, voltage application information to be used to execute voltage application control for altering the voltage by switching the polarity of the voltage, can be set. More specifically, each set of setting information indicates a positive voltage P to be applied, a negative voltage Q to be applied, a voltage application holding time T and the number of repetitions R. A first indicator to be used to indicate the specific particle reduction processing and a second indicator used to indicate a specific processing chamber are appended to P, Q, T and R. Namely, the first indicator corresponding to the first particle reduction processing is 1, whereas the first indicator corresponding to the second particle reduction processing is 2. In addition, the first processing chamber 200A to the fourth processing chamber 200D are respectively indicated by values 1~4 appended as the second indicator.

The voltage application holding time T is the length of time over which the application of the positive voltage P and/or the negative voltage Q is held, and the number of repetitions R is the number of times a full cycle of voltage application pattern (e.g., positive, 0, negative, 0) is repeated. By applying the voltage with such a voltage application pattern to the electrostatic chuck 214, particles can be lifted off and scattered effectively due to maxwell stress or the like. By applying the voltage with the voltage application pattern with, for instance, the positive voltage P set equal to or higher than approximately 1500V and the negative voltage Q set equal to or lower than approximately −1500V, particles can be lifted off and scattered even more effectively.

The force applied to the particles is constantly at work while the voltage is being applied, and the quantity of particles being lifted off and scattered markedly increases with the timing with which the voltage is altered (particularly with the timing with which either the positive or negative voltage is applied). Since the voltage is switched and thus altered with the voltage application pattern described above, particles can be made to scatter in greater quantity. The application pattern described above is particularly effective in lifting off and scattering particles since the voltage polarity is altered to ensure that even particles that have not been lifted off and scattered during the positive voltage application can be lifted off and scattered during the negative voltage application.

It is to be noted that a voltage application pattern other than that described above may be used. For instance, a pattern in which a positive voltage application and a zero voltage application are alternately executed, or a pattern in which a negative voltage application and a zero voltage application are alternately executed, may be adopted. In addition, the voltage may be applied with an AC waveform pattern by applying an AC voltage to the electrostatic chuck 214.

The data tables shown in FIGS. 6A and 6B allow the voltage application information related to the voltage applications to the electrostatic chucks 214 in the individual processing chambers (the first processing chamber 200A to the fourth processing chamber 200D) for the first particle reduction processing and the voltage application information related to the voltage applications to the electrostatic chucks 214 in the processing chambers for the second particle reduction processing to be set separately from each other. As a result, different voltage settings can be selected for the first particle reduction processing and the second particle reduction processing in correspondence to each processing chamber. For instance, depending upon the particulars of the structure adopted in a processing chamber, the voltage applied to the electrostatic chuck 214 during the first particle reduction processing executed in the low pressure environment can be set lower than the voltage applied during the second particle reduction processing executed in the high-pressure environment. As a result, optimal voltage settings can be set for each processing chamber while preventing the occurrence of an abnormal electrical discharge.

The results of tests executed based upon Paschen's law explained earlier in processing chambers adopting a plurality of different structures indicate that it is desirable that in a processing chamber in which a polysilicon film or the like on a wafer can be etched, a voltage equal to ±2500V or outside the −2500V to +2500V range be applied at a low pressure of, for instance, $1.2 \times 10^2$ Pa (900 mTorr) for the first particle reduction processing and that a voltage equal to ±2500 or outside the −2500V to +2500V range be applied at a high pressure of $2.7 \times 10^2$ Pa (2 Torr) for the second particle reduction processing. In addition, it is desirable that in a processing chamber in which an oxide film or the like on the wafer can be etched, a voltage equal to ±2500 V or outside the −2500V to +2500V range be applied at a low pressure of 33 Pa (250 mTorr) for the first particle reduction processing and a voltage equal to ±2500 V or outside the −2500V to +2500V range be applied at a high pressure of $2.7 \times 10^3$ Pa (20 Torr) for the second particle reduction processing.

(Specific Example of Cleaning Processing)

Next, a specific example of the cleaning processing executed to clean the inside of the processing chamber, as achieved in the embodiment, is explained. In the cleaning processing, the two-phase particle reduction processing described above is executed. The cleaning processing is executed based upon the cleaning processing setting information in conformance to the cleaning processing program read out by the control unit 300.

Figure 7:
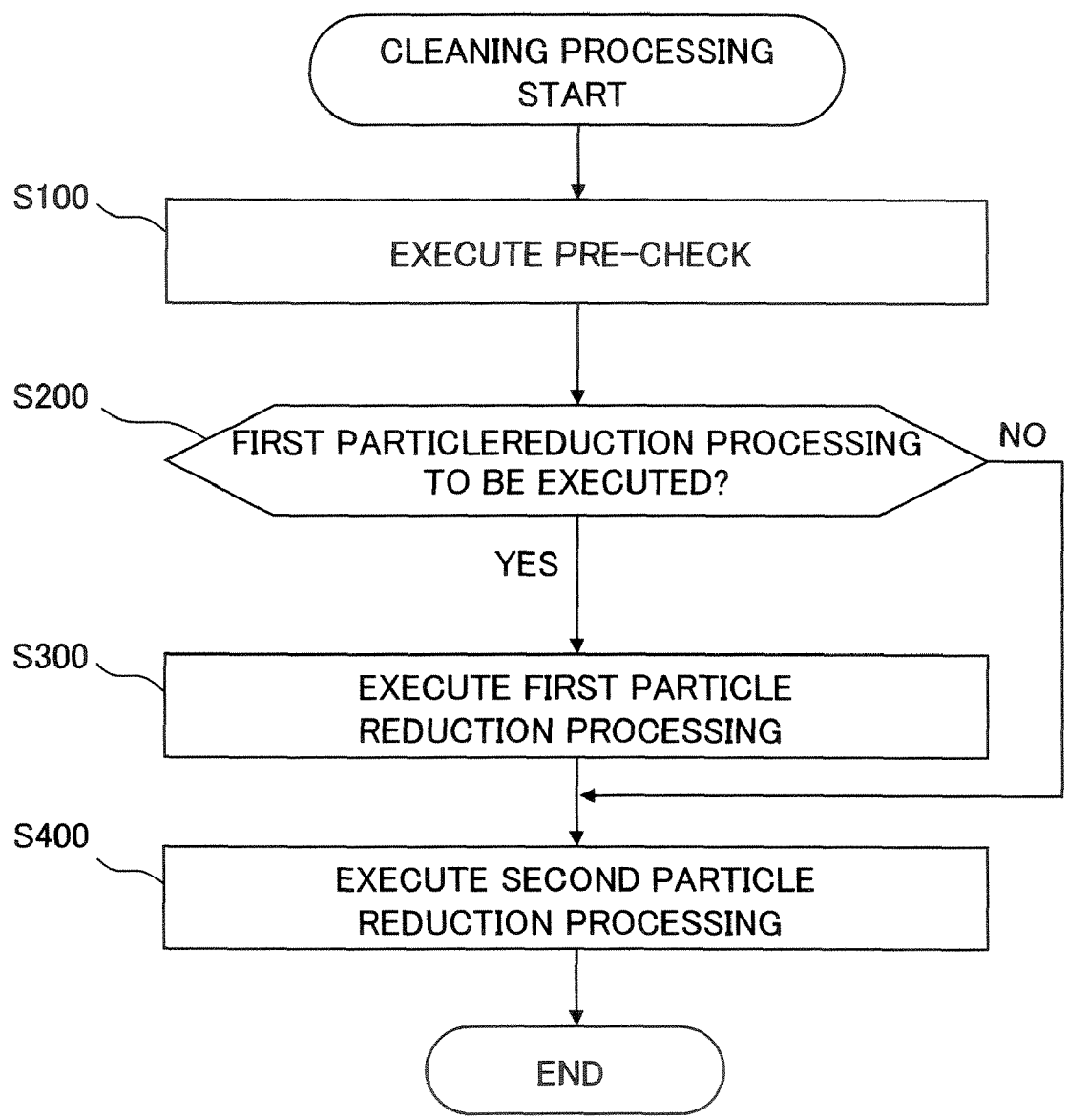
FIG. 7 presents a flowchart of a specific example of the cleaning processing executed in the embodiment.

A specific example of the cleaning processing is now explained in reference to drawings. FIG. 7 presents a flowchart of the specific example of cleaning processing. The cleaning processing includes the first particle reduction processing (step S300) and the second particle reduction processing (step S400). The first particle reduction processing is low-pressure processing executed by setting the pressure inside the processing chamber to a low level (e.g., a level close to that set when executing wafer processing such as plasma etching), whereas the second particle reduction processing is high-pressure processing executed by setting the pressure inside the processing chamber to a level higher than that set for the low-pressure processing.

During the second particle reduction processing, processing for briefly drawing a large quantity of gas, the pressure of which is substantially equal to atmospheric pressure into the processing chamber is also executed. The pressure difference induced by drawing in such a gas causes a shock wave, the velocity of which can be as high as the speed of sound, and the particles stuck on the stage and the side wall inside the processing chamber can be efficiently lifted off with this shock wave.

In the cleaning processing shown in FIG. 7, a pre-check is executed in step S100 prior to the executions of the first particle reduction processing and the second particle reduction processing. The pre-check is executed to ascertain whether or not the processing chamber 200 is in a state that allows particle reduction processing to be carried out in a normal manner.

For instance, if wafer processing is in progress, if a wafer is currently present in the processing chamber, if an outgoing wafer is being carried out of the processing chamber or if maintenance work is in progress, the conditions in processing chamber 200 is not those in which normal execution of particle reduction processing can be carried out. The wafer processing may include phases such as a processing gas drawing phase, a back gas drawing phase during which a back gas for wafer temperature adjustment or the like is drawn in, a control phase during which the electrostatic chuck 214 for holding the wafer is controlled and a control phase during which the high-frequency power sources are controlled. The outgoing wafer transfer may include a gate opening phase during which the gate to the processing chamber is opened. The maintenance work may include a lid opening phase during which the lid of the processing chamber is opened.

Under any of those circumstances, the processing chamber 200 is not in a state that allows particle reduction processing to be carried out in a normal manner. For this reason, the state of the processing chamber 200 is checked in advance, and if it is decided that the processing chamber 200 is not in a particle reduction processing enabling state, the particle reduction processing ends in an error.

If it is decided in step S100 that the conditions in the processing chamber 200 allow a normal execution of the particle reduction processing, a decision is made in step S200 as to whether or not the first particle reduction processing is to be executed. The decision as to whether or not the first particle reduction processing is to be executed may be made for each processing chamber based upon, for instance, the first particle reduction processing GO/NO GO setting information shown in FIG. 5.

If it is decided in step S200 that the first particle reduction processing is to be executed, the first particle reduction processing is executed in step S300 and then, in step S400, the second particle reduction processing is executed. If, on the other hand, it is decided in step S200 that the first particle reduction processing is not to be executed, the second particle reduction processing is executed in step S400 by skipping the first particle reduction processing in step S300.

Figure 8:
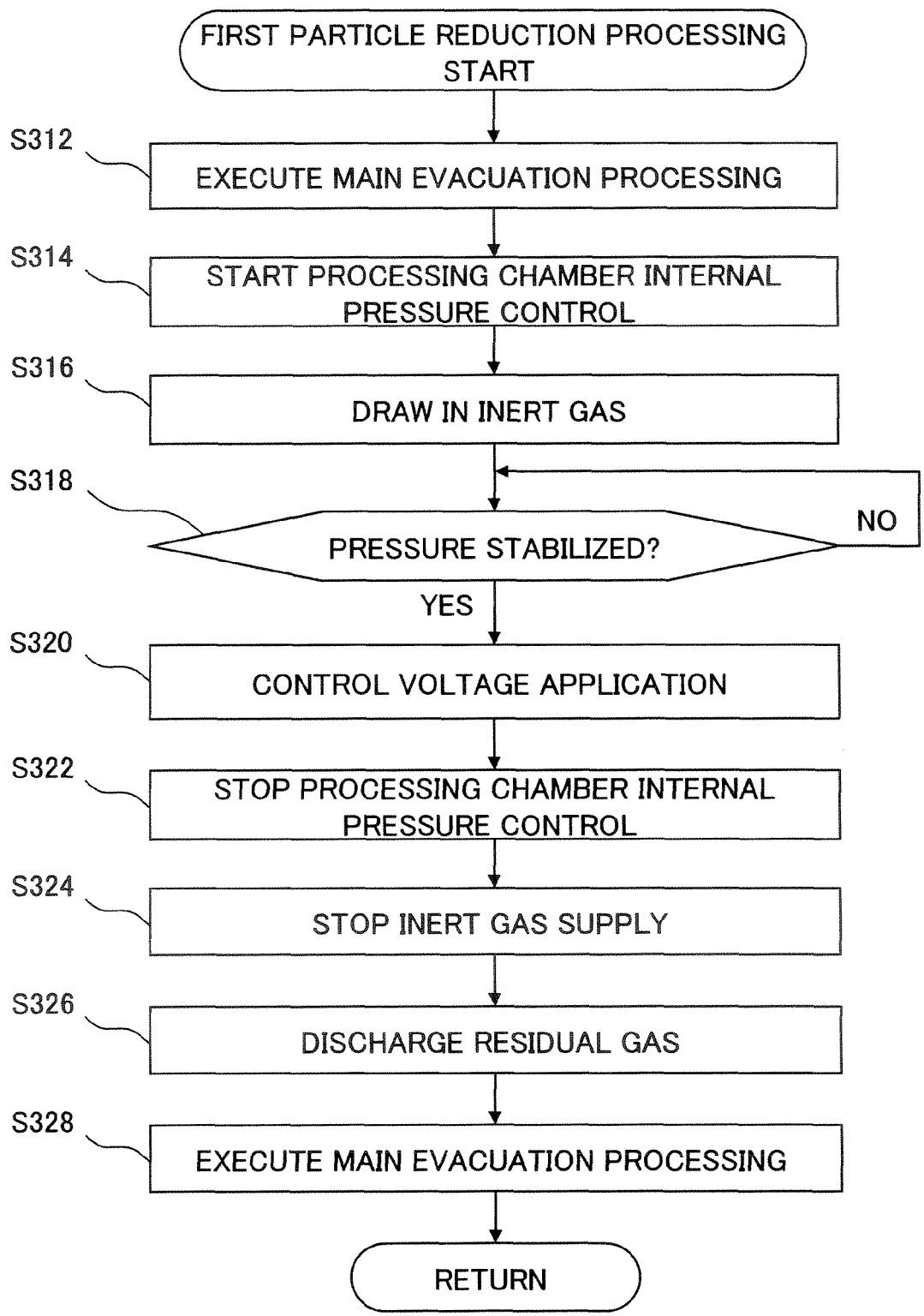
FIG. 8 presents a flowchart of a specific example of the first particle reduction processing in FIG. 7.

A specific example of the first particle reduction processing (step S300) is now explained in reference to FIG. 8. During the first particle reduction, main evacuation processing is first executed in step S312, as shown in FIG. 8. Namely, the processing chamber 200 is evacuated via the main pump 282 until a predetermined degree of high vacuum pressure is achieved. If the pressure inside the processing chamber 200 is not at a predetermined level at which the main evacuation processing is enabled, roughing vacuum processing should be executed first by the auxiliary pump 272, and the main evacuation processing should be executed via the main pump 282 after the pressure inside the processing chamber reaches the predetermined level at which the main evacuation processing is enabled. It is to be noted that if the predetermined degree of high vacuum pressure is not achieved after a predetermined length of time, a timeout occurs and the processing ends in an error. Next, pressure control is executed via a pressure adjusting valve (not shown) at, for instance, the main discharge system 280 so as to set the pressure inside the processing chamber 200 to a predetermined low level (e.g., a level equal to the pressure selected when executing wafer processing such as etching).

Then, the inert gas (e.g., $N_2$ gas) is drawn into the processing chamber 200 in step S316. The inert gas is drawn in through the processing gas supply system 240 via the communicating pipe 234 in this step. More specifically, the upstream-side gas supply valve 254 and the communicating valve 236 are opened while leaving the downstream-side gas supply valves 268 and 258 in the inert gas supply system 250 in a closed state and, at the same time, the downstream-side gas supply valve 248 and the main valve 232 are opened while leaving the upstream-side gas supply valve 244 of the processing gas supply system 240 in a closed state. As a result, the inert gas (e.g., $N_2$ gas) from the inert gas supply source 252 is drawn into the processing chamber 200 through the processing gas supply system 240 via the communicating pipe 234.

Then, in step S318, a decision is made as to whether or not the pressure inside the processing chamber 200 has become stable and if it is decided that the pressure in the processing chamber 200 has stabilized, the operation proceeds to step S320 to execute the voltage application control. As a result, it becomes easier to lift and scatter the particles in the processing chamber 200 and thus the particles can be removed more effectively. For instance, the voltage application information in FIG. 6A indicating the positive voltage $P_1$, a negative voltage $Q_1$, the voltage application holding time $T_1$ and the number of repetitions $R_1$ for the first particle reduction processing may be extracted and the voltage applied to the electrostatic chuck 214 may be controlled based upon the extracted voltage application information. Based upon such extracted voltage application information, a full cycle of polarity switching control pattern whereby the positive voltage $P_{11}$ is applied to the electrostatic chuck 214, the voltage application is turned off (the voltage is set to 0) after the voltage application holding time $T_{11}$ (e.g., 2 sec) elapses, the negative voltage $Q_{11}$ is applied to the electrostatic chuck 214 and then the voltage application is turned off (the voltage is set to 0) after the voltage application holding time $T_{11}$ (e.g., 2 sec) elapses, is repeated the number of times indicated as the number of repetitions $R_{11}$ during the first particle reduction processing for the first processing chamber 200A, for instance.

Once this voltage application control ends, the processing chamber internal pressure control is stopped in step S322 by, for instance, fully opening the pressure adjusting valve (not shown) at the main discharge system 280. Next, the upstream-side gas supply valve 254 at the inert gas supply system 250 is closed in step S324 thereby stopping the inert gas supply. At this time, the communicating valve 236, the downstream-side gas supply valve 248 at the processing gas supply system 240 and the main valve 232 are left in an open state. By executing evacuation processing in step S326 in this state, any residual gas present in the processing gas supply system 240 and the communicating pipe 234 is discharged.

Next, main evacuation processing is executed again in step S328. More specifically, the processing chamber 200 is evacuated via the main pump until the predetermined high degree of vacuum is achieved. Once the predetermined high degree of vacuum is achieved within a predetermined length of time, the main evacuation processing is stopped by, for instance, closing the pressure adjusting valve (not shown) at the main discharge system 280. It is to be noted that if the predetermined high degree of vacuum is not achieved when the predetermined length of time has elapsed, a timeout occurs and the processing ends in an error. The sequence of the first particle processing thus ends. It is to be noted that the first particle reduction processing may be executed repeatedly a predetermined number of times.

Figure 9:
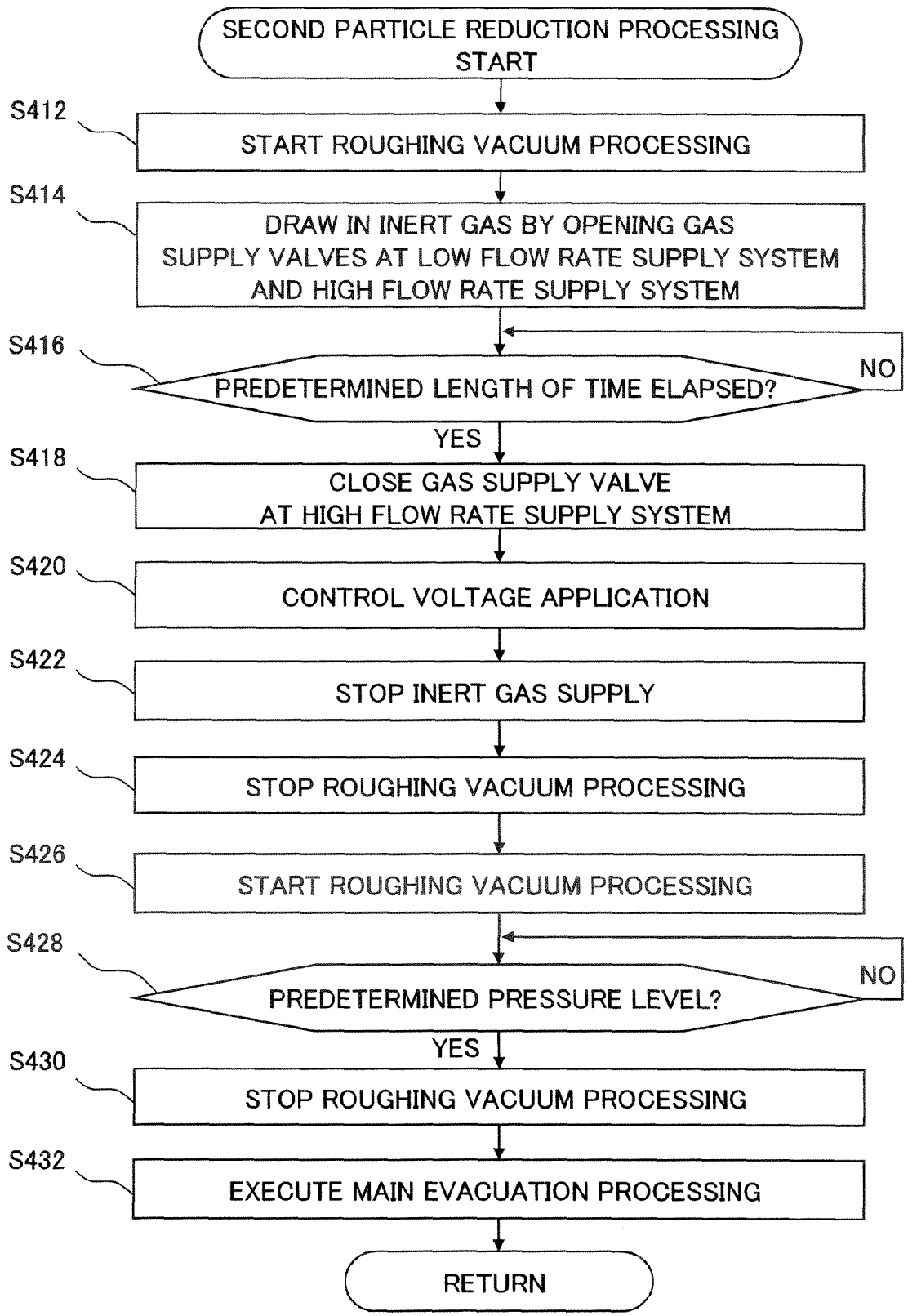
FIG. 9 presents a flowchart of a specific example of the second particle reduction processing in FIG. 7.

In reference to FIG. 9, a specific example of the second particle reduction processing (step S400) is explained. In the second particle reduction processing, roughing vacuum processing is first started in step S412, as shown in FIG. 9. Namely, the processing chamber 200 is evacuated via the auxiliary discharge system 290 by driving the auxiliary pump 272. It is desirable to close the protective valve at the vacuum pressure gauge at the start of the second particle reduction processing so as to protect the vacuum pressure gauge during the second particle reduction processing.

Then, in step S414, the inert gas is drawn into the processing chamber 200 through the inert gas supply system 250, which is an atmospheric pressure system. In this step, the inert gas is drawn in by using both the low flow rate supply system 265 and the high flow rate supply system 255. Namely, the inert gas is drawn in by opening the upstream-side gas supply valve 254 and also by opening the downstream-side gas supply valves 268 and 258 and the main valve 232. Then, in step S416, the operation waits for a predetermined length of time (e.g., 5 sec) to elapse. Once the predetermined length of time elapses, the downstream-side gas supply valve 258 at the high flow rate supply system 255 is closed in step S418 so as to draw in the inert gas from the low flow rate supply system 265 alone.

Next, voltage application control is executed in step S420. The voltage application information in FIG. 6B indicating the positive voltage $P_2$, the negative voltage $Q_2$, the voltage application holding time $T_2$ and the number of repetitions $R_2$ for the second particle reduction processing is extracted and the voltage applied to the electrostatic chuck 214 is controlled based upon the extracted voltage application information. Based upon the extracted voltage application information, a full cycle of polarity switching control pattern whereby the positive voltage $P_{21}$ is applied to the electrostatic chuck 214, the voltage application is turned off (the voltage is set to 0) after the voltage application holding time $T_{21}$ (e.g., 2 sec) elapses, the negative voltage $Q_{21}$ is applied to the electrostatic chuck 214 and then the voltage application is turned off (the voltage is set to 0) after the voltage application holding time $T_{21}$ (e.g., 2 sec) elapses, is repeated over the number of times indicated as the number of repetitions $R_{21}$ during the second particle reduction processing for the first processing chamber 200A, for instance.

Next, the supply of the inert gas is stopped in step S422 and the roughing vacuum processing ends in step S424. More specifically, the upstream-side gas supply valve 254 and the downstream-side gas supply valve 258 in the inert gas supply system 250 are first closed to stop the supply of the inert gas while the roughing vacuum processing is in progress and the main valve 232 is still in an open state, and then the operation waits for a predetermined length of time to elapse. As a result, any residual particles remaining in the processing chamber can be removed. Once the predetermined length of time elapses, the auxiliary pump 272 is stopped and the roughing vacuum processing ends.

In the subsequent processing (steps S426~S434), a predetermined level of vacuum pressure is achieved within the processing chamber. First, the roughing vacuum processing is resumed in step S426 and a decision is made in step S428 as to whether or not the predetermined pressure level at which main evacuation processing can be executed has been achieved. Namely, since the pressure inside the processing chamber is not at the level at which the main evacuation processing can be executed at the point in time at which the roughing vacuum processing in step S424 ends, the roughing vacuum processing is resumed until the predetermined pressure level is achieved.

If it is decided in step S428 that the predetermined pressure level has been achieved in the processing chamber, the roughing vacuum processing is stopped in step S430, and the main evacuation processing is executed in step S432. In other words, the processing chamber is evacuated by driving the main pump 282. This processing is executed by evacuating the processing chamber by leaving the main valve 232 in an open state so as to also evacuate the processing gas supply system 240 at the same time. Then, once the predetermined level of vacuum pressure is achieved, the main valve 232 is closed and the main evacuation processing is stopped, thereby ending the sequence of the second particle reduction processing. It is to be noted that the second particle reduction processing may be repeatedly executed a predetermined number of times.

The cleaning processing executed in the embodiment described above allows different voltages to be set for the first particle reduction processing and the second particle reduction processing and also allows different voltages to be set for the individual processing chambers 200A~200D. As a result, optimal voltage settings for the individual processing chambers can be selected while preventing the occurrence of an abnormal electrical discharge during the cleaning processing in each of the processing chambers 200A~200D.

In addition, if an abnormal electrical discharge tends to occur only during the first particle reduction processing, a setting for not executing the first particle reduction processing can be selected. This also prevents the occurrence of an abnormal electrical discharge during the cleaning processing.

Figure 10:
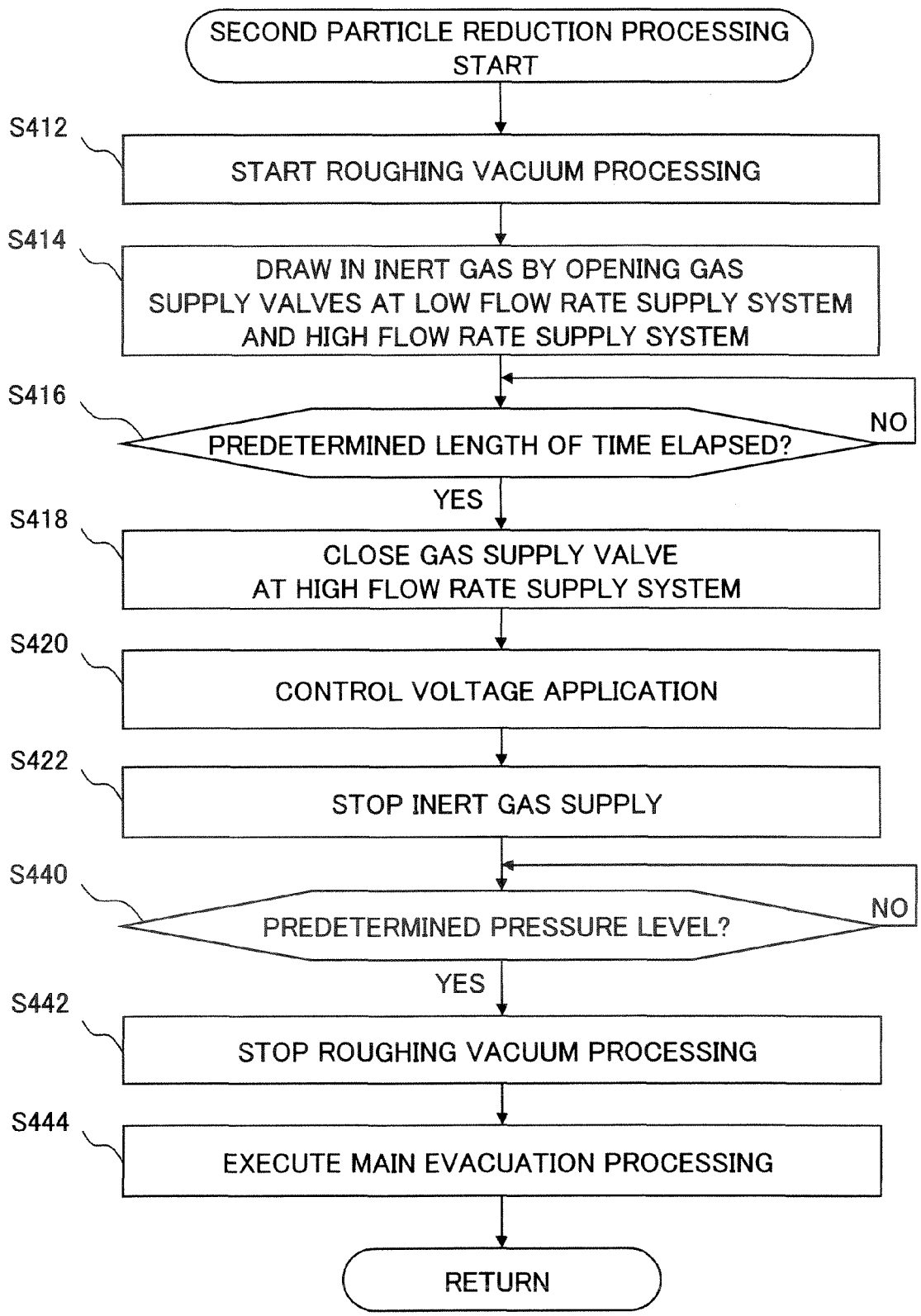
FIG. 10 presents a flowchart of a variation of the second particle reduction processing in FIG. 7.

By executing the two-phase processing that includes the first particle reduction processing executed under low-pressure conditions and the second particle reduction processing executed under high pressure conditions, particles and the like present in the processing chamber 200 can be removed with higher efficiency. In addition, a gas shock wave is generated during the second particle reduction processing in the embodiment as the inert gas (e.g., $N_2$ gas) is briefly drawn into the processing chamber 200 over a predetermined length of time (e.g., 5 sec) at a high flow rate, and particles having settled on the inner wall of the processing chamber 200, on the stage and the like can be efficiently lifted off with the gas shock wave It is to be noted that step S424 (in which the roughing vacuum processing is stopped) may be skipped during the second particle reduction processing. In such a case, the roughing vacuum processing may be continuously executed after stopping the inert gas supply in step S422, a decision may be made in step S440 as to whether or not the predetermined pressure at which the main evacuation processing can be executed has been achieved, the roughing vacuum processing may be stopped in step S442 if it is decided that the predetermined pressure level has been achieved, and the main evacuation processing may be executed in step S444, as shown in FIG. 10. This alternative method requires the roughing vacuum processing to be stopped or started only when necessary and sets the pressure inside the processing chamber to the predetermined vacuum pressure without having to repeatedly execute the roughing vacuum processing, which leads to a reduction in the length of time required to execute the second particle reduction processing. This advantage of reduced execution time becomes more significant when the second particle reduction processing is executed a plurality of times.

Furthermore, the main evacuation processing in step S432 in FIG. 9 or a step S444 in FIG. 10 may be executed within the processing chamber alone to reduce the length of time required for the main evacuation processing, since the main evacuation processing does not need to be executed for the inert gas supply system in the second particle reduction processing and also since the inert gas supply system having been evacuated in step S326 during the first particle reduction processing does not need to undergo the main evacuation processing again during the second particle reduction processing.

In addition, while an explanation is given above in reference to the embodiment on an example in which the inert gas supply system 250 is constituted with two subsystems, i.e., the low flow rate supply system 265 and the high flow rate supply system 255, and a gas shock wave is generated by drawing in the inert gas at a high flow rate briefly at the beginning of the second particle reduction processing, it is not absolutely necessary to use such a gas shock wave during the cleaning processing. Namely, the inert gas may be supplied at a constant flow rate during the second particle reduction processing. In such a case, the inert gas supply system 250 may be constituted with a single supply system. Some processing chambers assume structures that do not allow the inert gas to be drawn in at a high enough flow rate to generate a gas shock wave. It is desirable that the cleaning processing according to the present invention be executed for such a processing chamber without generating a gas shock wave by efficiently lifting off and scattering particles through optimal control of the voltage application to the electrostatic chuck.

It is to be noted that the cleaning processing may be executed during, for instance, maintenance work. The cleaning processing may also be executed over predetermined time intervals or after a predetermined number of wafers are processed through automatic inspection processing (auto-check processing). In the latter case, purge processing executed by using the inert gas (e.g., $N_2$ gas) may be stopped before executing the main evacuation processing (step S312) as part of the first particle reduction processing, information indicating that the particle reduction processing is in progress may be brought up at the display means 340, the information indicating that the particle reduction processing is in progress may be cleared from the display means 340 after the main evacuation processing (step S432 in FIG. 9 or step S444 in FIG. 10) is executed as part of the second particle reduction processing and then the purge processing that uses the inert gas (e.g., $N_2$ gas) may be resumed.

For instance, if a setting for executing the cleaning processing over predetermined time intervals or after a predetermined number of wafers have been processed through automatic inspection processing (auto-check processing) is selected, the operation may shift into the cleaning processing during batch processing of wafers each divided into lots of, for instance, 25 wafers. Under such circumstances, if the operation needs to shift into the cleaning processing while the purge processing is executed by using the inert gas (e.g., $N_2$ gas), the purge processing executed by using the inert gas must first be stopped. In the case of maintenance processing, on the other hand, the purge processing will have been completed before the operation shifts to maintenance processing and, accordingly, it is not necessary to GO through the sequence of stopping the purge processing executed by using the inert gas and then executing the cleaning processing.

It is to be noted that while an explanation is given above in reference to the embodiment on an example in which different settings can be selected for the voltage to be applied to the stage during the first particle reduction processing and the second particle reduction processing, the present invention may be embodied by allowing a selection of different pressure settings. According to Pachen's Law explained earlier, the occurrence of an abnormal electrical discharge can be prevented by adjusting the pressure and the range of the voltage applied to the stage, over which an electrical discharge does not occur, can be increased through pressure adjustment.

In more specific terms, the graph of the electrical discharge start voltage in FIG. 3 indicates that an electrical discharge occurs less readily at lower pressures over the range preceding the point corresponding to the electrical discharge start voltage minimal value and discharge occurs less readily at higher pressures over the range beyond the point corresponding to the electrical discharge start voltage minimal value. This means that the occurrence of an abnormal electrical discharge can be prevented effectively and the voltage range over which discharge does not occur can be increased by adjusting the pressure to a lower setting over the range preceding the electrical discharge start voltage minimal value point and adjusting the pressure to a higher setting over the range beyond the electrical discharge start voltage minimal value point.

The present invention described in detail above in reference to the embodiment may be adopted in a system constituted with a plurality of devices or in an apparatus constituted with a single device. It will be obvious that the present invention may be implemented by providing such a system or apparatus with a medium such as a storage medium having stored therein a software program for achieving the functions of the embodiment, and by reading out and executing the program stored in a medium such as a storage medium at a computer (or a CPU or an MPU) constituting part of the system or the apparatus.

The functions of the embodiment described above are achieved in the program itself, read out from the medium such as a storage medium, whereas the present invention is embodied in the medium such as a storage medium having the program stored therein. The medium such as a storage medium in which the program is provided may be, for instance, a floppy (registered trademark) disk, a hard disk, an optical disk, a magneto-optical disk, a CD-ROM, a CD-R. a CD-RW, a DVD-ROM, a DVD-RAM, a DVD-RW, a DVD+RW, magnetic tape, a nonvolatile memory card or a ROM, or it may be achieved in the form of a download via a network.

It is to be noted that the scope of the present invention includes an application in which an OS or the like operating on the computer executes the actual processing in part or in whole in response to the instructions in the program read out by the computer and the functions of the embodiment are achieved through the processing thus executed, as well as an application in which the functions of the embodiments are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the embodiment on an example in which the cleaning processing according to the present invention is executed for the processing chambers, the cleaning processing may instead be executed for the loadlock chambers and it may be repeatedly executed a plurality of times.

In addition, while an explanation is given above in reference to the embodiment on an example in which the inside of the processing chambers in a plasma etching apparatus is cleaned, the present invention is not limited to this example and it may be adopted when cleaning the inside of processing chambers in all types of processing apparatuses including film forming apparatuses.

While an explanation is given above in reference to the embodiment on an example in which the voltage application control is executed during the cleaning processing for the stage disposed inside the processing chamber, on which a substrate undergoing the processing is placed, the present invention is not limited to this example and the voltage application control may be executed for any member disposed inside the processing chamber. For instance, the voltage application control may be executed for a component attached to the stage, such as a focus ring.

What is claimed is:

1. A method for cleaning a substrate processing apparatus that includes a processing chamber where a specific type of processing is executed on a processing target substrate, to be adopted when cleaning the inside of said processing chamber after transferring the processing target substrate out of said processing chamber, comprising:

a first processing step in which the inside of said processing chamber is cleaned without forming plasma by executing voltage application control to control voltage application to an electrostatic holding means for electrostatically holding the processing target substrate onto a stage, based upon a first application voltage stored in a setting information storage means, with said processing chamber sustaining a first pressure environment at a lower pressure level as a specific gas is supplied into said processing chamber via a gas supply system and said processing chamber is evacuated by an evacuation system; and a second processing step in which, with a second pressure environment assuming a second pressure higher than said first pressure created inside said processing chamber, the inside of said processing chamber is cleaned without forming plasma by executing voltage application control to control voltage application to said electrostatic holding means based upon a second application voltage stored in said setting information storage means while the specific gas is supplied into said processing chamber via said gas supply system and said processing chamber is evacuated by the evacuation system, wherein:

when an abnormal discharge is expected to occur inside said processing chamber while said first processing step is in progress based on the first application voltage having value higher than a first discharge start voltage determined in correspondence to the first pressure based upon a discharge start voltage curve, a voltage lower than the discharge start voltage is set as said first application voltage, and when an abnormal discharge is expected to occur inside said processing chamber while said second processing step is in progress based on the second application voltage having a value higher than a second discharge start voltage determined in correspondence to the second pressure based upon the discharge start voltage curve, a voltage lower than the second discharge start voltage is set as said second application voltage.

2. A method for cleaning a substrate processing apparatus according to claim 1, wherein:
when an abnormal discharge occurs inside said processing chamber, only said second processing step is executed without execution of said first processing step.

3. A method for cleaning a substrate processing apparatus according to claim 1, wherein:
said evacuation system includes an auxiliary pump with which the pressure inside said processing chamber is reduced through roughing and a main pump with which said processing chamber is evacuated to reduce the pressure therein to a level of vacuum;
said voltage application control for said electrostatic holding means is executed during said first processing step as the specific gas is supplied via said gas supply system and said processing chamber is evacuated by said main pump, supply of the specific gas via said gas supply system is stopped once said voltage application control ends and the pressure within said processing chamber is reduced by said main pump at least to the level of vacuum; and
said second processing step is executed by controlling the voltage application to said electrostatic holding means as the specific gas is supplied via said gas supply system and said processing chamber is evacuated by said auxiliary pump, stopping the supply of the specific gas via said gas supply system once said voltage application control ends, continuously evacuating said processing chamber with said auxiliary pump until the pressure inside said processing chamber reaches a predetermined level and reducing the pressure inside said processing chamber with said main pump until the pressure is lowered at least to the level of vacuum.

4. A method for cleaning a substrate processing apparatus according to claim 1, wherein:
said substrate processing apparatus includes a plurality of processing chambers; and
settings for said first application voltage and said second application voltage are stored in said setting information storage means in correspondence to each of said processing chambers.

5. A method for cleaning a substrate processing apparatus according to claim 1, wherein:
said first application voltage is set to a level lower than said second application voltage.

6. A method for cleaning a substrate processing apparatus according to claim 3, wherein:
once said voltage application control for said electrostatic holding means ends during said first processing step, said main pump is engaged in operation to evacuate both said processing chamber and said gas supply system until the level of vacuum is achieved; and
once said voltage application control for said electrostatic holding means ends during said second processing step, said processing chamber alone is evacuated using both said main pump and said auxiliary pump until the level of vacuum is achieved.

7. A method for cleaning a substrate processing apparatus according to claim 4, wherein:
when an abnormal discharge occurs inside any of said processing chambers, only said second processing step is executed without execution of said first processing step in the processing chamber.

8. A computer-readable recording medium having recorded therein a program for enabling cleaning processing to be executed on a substrate processing apparatus that includes a processing chamber where a specific type of processing is executed on a processing target substrate to be processed, to be adopted to clean the inside of said processing chamber after transferring the processing target substrate out of said processing chamber, with said program enabling a computer to execute:
a first processing step in which the inside of said processing chamber is cleaned without forming plasma by executing voltage application control to control voltage application to an electrostatic holding means for electrostatically holding the processing target substrate onto a stage, based upon a first application voltage stored in a setting information storage means, with said processing chamber sustaining a first pressure environment at a lower pressure level as a specific gas is supplied into said processing chamber via a gas supply system and said processing chamber is evacuated by an evacuation system; and
a second processing step in which, with a second pressure environment assuming a second pressure higher than said first pressure created inside said processing chamber, the inside of said processing chamber is cleaned without forming plasma by executing voltage application control to control voltage application to said electrostatic holding means based upon a second application voltage stored in said setting information storage means while the specific gas is supplied into said processing chamber via said gas supply system and said processing chamber is evacuated by the evacuation system, wherein:
when an abnormal discharge is expected to occur inside said processing chamber while said first processing step is in progress based on the first application voltage having a value higher than a first discharge start voltage determined in correspondence to the first pressure based upon a discharge start voltage curve, a voltage lower than the discharge start voltage is set as said first application voltage, and when an abnormal discharge is expected to occur inside said processing chamber while said second processing step is in progress based on the second application voltage having a value higher than a second discharge start voltage determined in correspondence to the second pressure based upon the discharge start voltage curve, a voltage lower than the second discharge start voltage is set as said second application voltage.

9. A computer-readable recording medium according to claim 8, wherein:
when an abnormal discharge occurs inside said processing chamber, only said second processing step is executed without execution of said first processing step.

* * * * *